United States Patent
Bhutani et al.

(10) Patent No.: US 7,260,801 B2
(45) Date of Patent: Aug. 21, 2007

(54) DELAY COMPUTATION SPEED UP AND INCREMENTALITY

(75) Inventors: Sandeep Bhutani, Pleasanton, CA (US); Qian Cui, San Jose, CA (US); Weiqing Guo, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 112 days.

(21) Appl. No.: 11/192,526

(22) Filed: Jul. 29, 2005

(65) Prior Publication Data

US 2007/0028199 A1 Feb. 1, 2007

(51) Int. Cl.
*G06F 17/50* (2006.01)

(52) U.S. Cl. .................. 716/6; 716/4; 716/5

(58) Field of Classification Search .............. 716/6, 716/5, 4

See application file for complete search history.

(56) References Cited

U.S. PATENT DOCUMENTS

| | | | |
|---|---|---|---|
| 5,903,468 A * | 5/1999 | Misheloff et al. ............. | 703/16 |
| 6,532,576 B1 * | 3/2003 | Mbouombouo et al. ....... | 716/6 |
| 6,546,541 B1 * | 4/2003 | Petranovic et al. ........... | 716/18 |

* cited by examiner

*Primary Examiner*—Sun James Lin
(74) *Attorney, Agent, or Firm*—Luedeka Neely & Graham

(57) ABSTRACT

A method of computing output delay in a mathematical model of an integrated circuit by sorting cells of original design of an the integrated circuit in a topological order. The original output delays for the sorted cells in the original design are computed in the topological order, to produce original output ramp times. The original output ramp times are propagated and original output delays are computed, and the original output ramp time and original output load for each cell is stored. The cells of the original design are modified to produce a modified design. For each modified cell in the topological order, a new output delay and a new output ramp time are computed and compared to the original output ramp time on the modified cell. When the new output ramp time substantially equals the original output ramp time for a modified cell, the calculations of the modified output ramp time for cells that are further down in the topological order are stopped. Otherwise the calculations of the modified output ramp time for cells that are further down in the topological order are continued until a cell is reached where the new output ramp time substantially equals the original output ramp time.

1 Claim, 1 Drawing Sheet

DELAY COMPUTATION SPEED UP AND INCREMENTALITY

FIELD

This invention relates to the field of Integrated circuit fabrication. More particularly, this invention relates to simplification of a mathematical modeling of an integrated circuit design when a modification to the interated circuit design has been made.

BACKGROUND

The delay computation process for an integrated circuit requires knowledge of ramp time and loading at each stage. The loading can be determined by picking up a stage and its driven net. However, the ramp time has to be determined through propagation of calculations through preceding stages.

The delay of a cell typically depends at least in part on the ramp time and the output loading. In a given integrated circuit design, the signal can propagate through several stages before being captured by a flip flop. The order of the signal propagation defines the order in which the delays are computed in the circuit. Thus, a two pin AND gate typically has ramp times that are computed for both its inputs before its delays are completely evaluated.

This implies that the stage after the AND gate, for example, is typically completely evaluated only after the AND gate has been completely evaluated. This creates a motivation to have a topological order for the circuit before computing the delays.

The various embodiments of the present invention can be used to reduce the run time of a delay calculation and static timing analysis. In addition, the embodiments can be used to support efficient timing updates in a static timing analyzer.

SUMMARY

The above and other needs are met by a method of computing output delay in a mathematical model of an integrated circuit original design by sorting cells of the original design in a topological order. The original output delays for the cells in the original design are computed in the sorted order, to produce original output ramp times. The original output ramp times are propagated and original output delays are computed, and the original output ramp time and original output load for each cell is stored. The cells of the original design are modified to produce a modified design. For each modified cell in the topological order, a new output delay and a new output ramp time are computed and compared to the original output ramp time on the modified cell. When the new output ramp time substantially equals the original output ramp time for a modified cell, the calculations of the modified output ramp time for cells that are further down in the topological order are stopped. Otherwise the calculations of the modified output ramp time for cells that are further down in the topological order are continued until a cell is reached where the new output ramp time substantially equals the original output ramp time.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
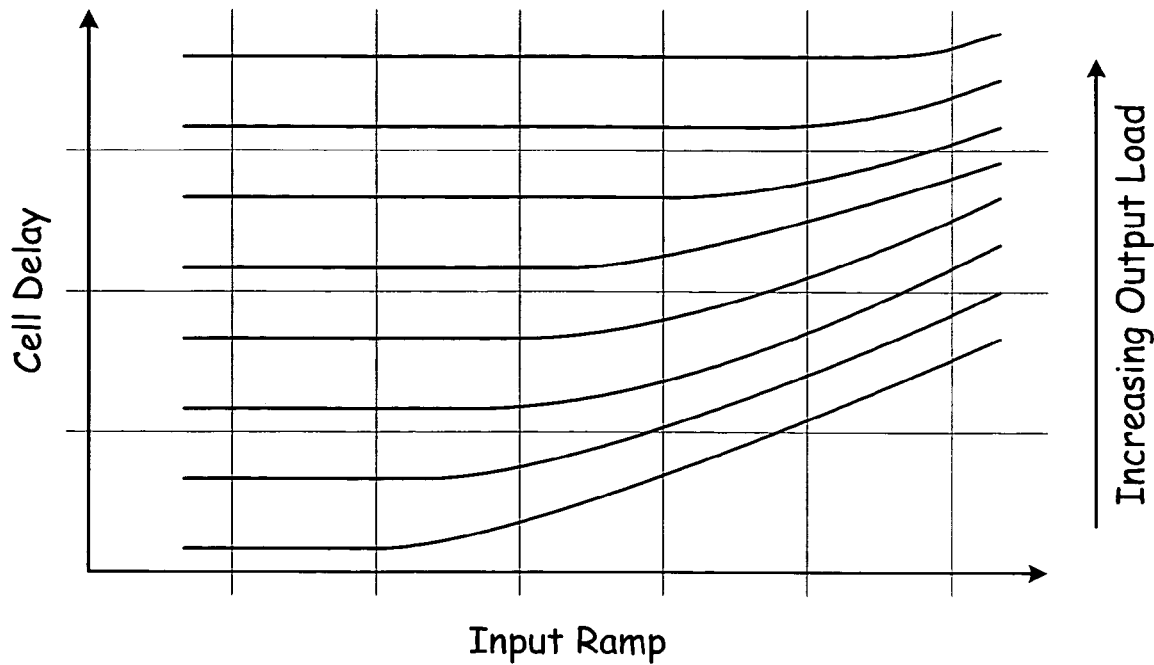
FIG. 1 a plot of cell delay as a function of input ramp for various output loads.
Figure 2:
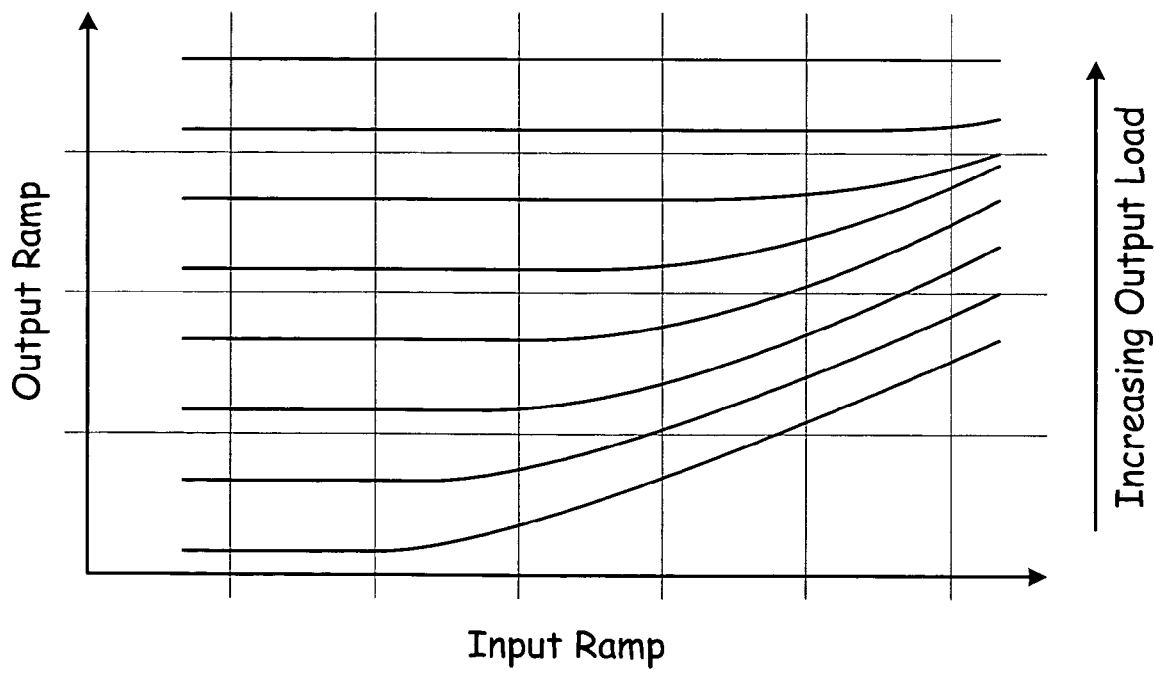
FIG. 2 is a plot of output ramp as a function of input ramp for various output loads.

The following discussion refers to the curve depicted in FIGS. 1 and 2. It has been observed that the delay of a gate is a "sub-linear" function of input ramp time. What this means is that the input ramp time has only a secondary impact on the delay of a gate. This is explained in the example below, which illustrates the variation of delay with input ramp time for a standard cell like an inverter. However, it is appreciated that the method is applicable to other cells of an integrated circuit design.

Different nets in an integrated circuit design have different output loadings. For very large output loads, the output ramp is a substantially constant value, regardless of the level of the input ramp. This saturation means that the output ramp for a given net is substantially set at a given value when the output load is at or above this saturation value, regardless of the level of the input ramp. For smaller output loads, below the saturation value, the load function can be separated into two parts, an initial flat part for smaller input ramps, where the output ramp tends to be dependent only on the output load, which tends to be constant. As input ramp increases there is a second part of the function, where output ramp/input ramp starts to behave like a linear relationship (input ramp dependent).

When closely inspected, the output ramp in this second part of the function tends to always be below the Y=X line, meaning that in this second part of the function (the input ramp dependent region), the output ramp tends to be smaller than the input ramp. This is why a digital circuit is stable with an amplification coefficient of less then one for ramp time.

From such curves it is inferred that for a circuit like an inverter chain, with the same cell/net for every stage, the circuit always stabilizes at an output ramp which corresponds to the first, flat part of the curve regardless of the position of the initial input ramp. The reason for this may be two-fold. First, if the cell is in the first, flat part of the curve, from the second cell on, the output ramp time is already stable. Second, if the cell is in the second, linear part of the curve, the output ramp tends to be smaller than the input ramp.

Applicability to Delay Calculation

This means that for an output delay calculation for a small change in the design (such as a single gate), the entire design does not need to be recomputed. Only the effected part is preferably recomputed. Thus, the output delay computation flow would look as follows:

1. Sort cell in entire design a topological order.
2. Compute the output delays for every cell in the design in a sorted order. Keep propagating the output ramp times and computing the output delays as and when they become available. The output ramp time and output loading for each stage is stored.
3. Open the database for edits.
4. For each cell change in the sorted order, compute the delay and the output ramp time.

5. Compare the output ramp time to the pre-existing output ramp time on that cell. If the new ramp time is the same as before, then stop the propagation. Otherwise, continue the propagation until stability is attained.

Steps four and five are steps that enable a reduced computational load for determining delay when relatively minor modifications have been made to the design. It has been determined through experiments that the ramp time rarely propagates beyond three stage.

Applicability to Timing Analysis

As is evident from the discussion above, the ramp time stabilizes after a few stages. The number of these stages is usually two or three. This means that during the timing analysis propagation stage, after modification, the delays do not change after a few stages. Thus, the delays need not be recomputed beyond a few stages, such as two or three.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of computing output delay in a mathematical model of an integrated circuit, the method comprising the steps of:

sorting cells of an original design of the integrated circuit in a topological order, computing original output delays for the sorted cell in the original design in the topological order, to produce original output ramp times, propagating the original output ramp times and computing original output delays, storing the original output ramp time and original output load for each cell, modifying cells of the original design to produce a modified design, for each modified cell in the topological order, computing a new output delay and a new output ramp time, comparing the new output ramp time to the original output ramp time on the modified cell, and when the new output ramp time substantially equals the original output ramp time for the modified cell, stop calculating a modified output ramp time for cell that are further down in the topological order, otherwise continue calculating the modified output ramp time for cells that are further down in the topological order until a cell at which the new output ramp time substantially equals the original output ramp time is reached.

* * * * *